(12) United States Patent
Wang et al.

(10) Patent No.: US 9,154,156 B2
(45) Date of Patent: Oct. 6, 2015

(54) TERNARY LINE CODE DESIGN FOR CONTROLLED DECISION FEEDBACK EQUALIZER ERROR PROPAGATION

(71) Applicant: QUALCOMM Incorporated, San Diego, CA (US)

(72) Inventors: Xiao Feng Wang, San Diego, CA (US); Stephen Jay Shellhammer, Ramona, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/335,357

(22) Filed: Jul. 18, 2014

(65) Prior Publication Data

US 2015/0244394 A1    Aug. 27, 2015

Related U.S. Application Data

(60) Provisional application No. 61/944,271, filed on Feb. 25, 2014, provisional application No. 61/952,399, filed on Mar. 13, 2014.

(51) Int. Cl.
    *H03M 5/16*      (2006.01)
    *H04L 25/49*      (2006.01)
    (Continued)

(52) U.S. Cl.
    CPC ............... *H03M 5/16* (2013.01); *H03M 5/145* (2013.01); *H03M 7/46* (2013.01); *H04L 25/49* (2013.01)

(58) Field of Classification Search
    CPC ... H03M 5/145; H03M 7/46; H03M 13/1102; H03M 13/1515; H03M 13/6343; H04L 25/49; H04N 19/61; H04N 19/124; H04N 19/152; H04N 19/172; H04N 19/159; G11B 20/1426; G11B 20/1833; G11B 20/1866
    USPC ....................... 341/55–65; 714/755; 382/232; 375/E7.139, E7.159, E7.181, E7.17, 375/240.26, 240.12, 240.24
See application file for complete search history.

(56) References Cited

U.S. PATENT DOCUMENTS

| 3,754,237 A | 8/1973 | De Laage De Meux |
| 5,003,555 A | 3/1991 | Bergmans |

(Continued)

FOREIGN PATENT DOCUMENTS

EP      0230714 A2      8/1987

OTHER PUBLICATIONS

International Search Report and Written Opinion—PCT/US2015/015595—ISA/EPO—May 29, 2015.

(Continued)

*Primary Examiner* — Lam T Mai
(74) *Attorney, Agent, or Firm* — Mahamedi Paradice LLP

(57) ABSTRACT

A method of line coding is disclosed that limits error propagation in a decision feedback equalizer (DFE) of a receiving device. A communications device receives a set of bits to be transmitted over a channel and divides the set of bits into a plurality of blocks based, at least in part, on a line coding scheme. The device then encodes each of the blocks of bits into a corresponding block of symbols based on the line coding scheme. Specifically, the line coding scheme has a non-uniform coding efficiency, wherein a first bit or a last bit of each block of bits is mapped to a single data symbol. For some embodiments, the line coding scheme may be a ternary line coding scheme that maps a block of $3k+1$ bits to a corresponding block of $2k+1$ symbols, where k is an integer greater than 1.

20 Claims, 12 Drawing Sheets

(51) Int. Cl.
*H03M 7/46* (2006.01)
*H03M 5/14* (2006.01)

(56) References Cited

U.S. PATENT DOCUMENTS

| | | | |
|---|---|---|---|
| 6,876,315 B1 * | 4/2005 | Widmer | 341/58 |
| 7,023,927 B2 * | 4/2006 | Modlin | 341/138 |
| 7,397,397 B1 * | 7/2008 | Duntoor et al. | 341/59 |
| 7,676,725 B1 * | 3/2010 | McAdoo et al. | 341/59 |
| 8,321,750 B2 * | 11/2012 | Kou | 341/59 |
| 8,634,450 B2 | 1/2014 | Vidal et al. | |
| 8,982,964 B2 * | 3/2015 | Tanaka et al. | 375/240.26 |
| 2009/0285271 A1 | 11/2009 | Perez et al. | |
| 2013/0028299 A1 | 1/2013 | Tsai | |
| 2013/0238961 A1 | 9/2013 | Bliss | |

OTHER PUBLICATIONS

"Ternary Line Codes and their Efficiency Bachelor Thesis by Thomas Schellekens", Bachelor Thesis, Jun. 1, 2007, XP055186530, Retrieved from the Internet: URL:http://www.utwente.nl/ewi/dacs/assignments/completed/bachelor/reports/B-assignment_Schellekens.pdf [retrieved on Apr. 29, 2015].

Wang X. et al., "PAM-3 Line Coding/Mapping For 1000 BASE-T1 Motivation", Taskforce meeting March plenary Meeting IEEE 802.3bp, Mar. 18, 2014, pp. 1-9, XP055186515, Retrieved from the Internet: URL: http://www.ieee802.org/3/bp/public/mar14/xiaofeng_3bp_02_0314.pdf [retrieved on Apr. 29, 2015].

* cited by examiner

TERNARY LINE CODE DESIGN FOR CONTROLLED DECISION FEEDBACK EQUALIZER ERROR PROPAGATION

RELATED APPLICATIONS

This application claims priority under 35 U.S.C. §119(e) of the commonly-owned U.S. Provisional Patent Application No. 61/944,271, titled "Ternary Line Code Design for Controlled DFE Error Propagation," filed Feb. 25, 2014; and U.S. Provisional Patent Application No. 61/952,399, titled "Ternary Line Code Design for Controlled DFE Error Propagation," filed Mar. 13, 2014; both of which are hereby incorporated by reference in their entirety.

TECHNICAL FIELD

The present embodiments relate generally to line coding, and specifically to controlling error propagation in decision feedback equalizers (DFEs) through line coding.

BACKGROUND OF RELATED ART

Line coding is a technique typically employed in baseband communication systems for purposes of clock recovery and/or spectral shaping. Specifically, line coding maps a bit stream to a symbol stream suitable for transmission over a given communications channel. For example, in conventional Ethernet systems, data is communicated between a transmitting device and a receiving device in an asynchronous manner. The receiving device therefore recovers a clock signal (to be used for sampling a received data signal) from the received data signal itself. In order to enable clock recovery, the received data signal should have edges (e.g., signal transitions) to which the receiving device can synchronize its local clock. Conventional line coding schemes are designed to provide frequent signal transitions, and thus shorter "runs" of the same consecutive symbol, for purposes of optimizing clock recovery.

A receiving device may also include a decision feedback equalizer (DFE) to help reduce and/or eliminate inter-symbol interference (ISI) in the received data signal. Through feedback, the DFE uses the determination (e.g., hard decision) of one or more last-sampled symbols to make a decision for the next symbol in the sequence. For example, the DFE may compare the waveform (e.g., shape and/or amplitude of the signal) for the received symbol with the ideal waveform for a symbol of the determined value to determine the effects of ISI in the communications channel. The DFE may then filter (e.g., subtract) the determined ISI characteristics from the next symbol in the sequence. However, because the DFE applies this filter through recursive feedback, any errors in the calculated ISI for a particular symbol may be propagated to (and possibly compounded by) the decisions for each of the remaining symbols in the sequence.

The "error propagation" issue, described above, may severely degrade the coding gain of a forward error correction (FEC) code that is typically implemented in modern communications systems. Various schemes have been developed to alleviate error propagation at the cost of increased complexity and/or increased transmit signal power.

BRIEF DESCRIPTION OF THE DRAWINGS

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method of line coding is disclosed that limits error propagation in a decision feedback equalizer (DFE) of a receiving device. A communication device receives a set of bits to be transmitted over a channel and divides the set of bits into a plurality of blocks based, at least in part, on a line code scheme. The device then encodes each of the blocks of bits into a corresponding block of symbols based on the line coding scheme. Specifically, the line coding scheme has a non-uniform coding efficiency, wherein a first bit or a last bit of each block of bits is mapped to a single data symbol. For some embodiments, a run length of each block of symbols may be less than a number of symbols in that block.

The line coding scheme may be a ternary line coding scheme that maps a block of 3k+1 bits to a corresponding block of 2k+1 symbols, where k is an integer value greater than 1. For example, each block of 3k+1 bits may be divided into m 6-bit groups, n 9-bit groups, and a 1-bit group, where k=2m+3n. The 1-bit group may be mapped to either a positive ternary symbol or a negative ternary symbol which corresponds to the first symbol or the last symbol in a particular block of symbols. For some embodiments, a mapping of the remaining 3k bits in the block may be based, at least in part, on a symbol value of the 1-bit group. For example, the mapping of the remaining 3k bits may be based on a first mapping scheme if the symbol value of the 1-bit group is positive, and may be based on a second mapping scheme if the symbol value of the 1-bit group is negative.

Each of the 6-bit groups may be mapped to a unique sequence of 4 ternary symbols. For some embodiments, each of the 6-bit groups may be further subdivided into two 3-bit groups. For example, one of the 3-bit groups may map to a sequence of 2 ternary symbols that excludes any sequence consisting of two consecutive positive ternary symbols. The other 3-bit group may map to a sequence of 2 ternary symbols that excludes any sequence consisting of two consecutive negative ternary symbols.

Each of the 9-bit groups may be mapped to a unique sequence of 6 ternary symbols. For some embodiments, each of the 9-bit groups may be further subdivided into three 3-bit groups. For example, one of the 3-bit groups may map to a sequence of 2 ternary symbols that excludes any sequence consisting of two consecutive positive ternary symbols. Another 3-bit group may map to a sequence of 2 ternary symbols that excludes any sequence consisting of two consecutive zero ternary symbols. The final 3-bit group may map to a sequence of 2 ternary symbols that excludes any sequence consisting of two consecutive negative ternary symbols.

The non-uniform coding efficiency implemented by the line coding method enables a DFE (e.g., of a receiving device) to easily and accurately detect the edges (e.g., the first and/or last symbol) of a received block of data symbols. As a result, any decision errors in the DFE may be constrained within a particular block of symbols, and thus prevented from propagating to subsequent symbol blocks. This reduces the likelihood and/or degree of symbol decoding errors at the receiving device. Furthermore, by ensuring that the run-length of each block of symbols is less than the total number of symbols in that block, the line coding method may also improve clock recovery at the receiving device, for example, by increasing the likelihood and/or frequency of signal transitions in the symbol sequences output by the transmitting device.

BRIEF DESCRIPTION OF THE DRAWINGS

Figure 1:
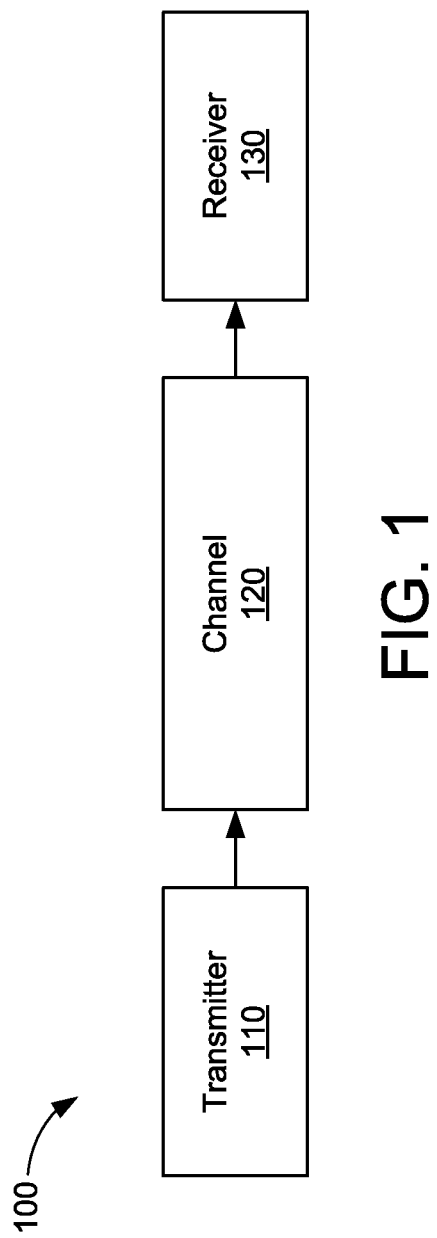

The present embodiments are illustrated by way of example and are not intended to be limited by the figures of the accompanying drawings, where:

FIG. 1 shows a communications system in accordance with some embodiments.

Figure 2:
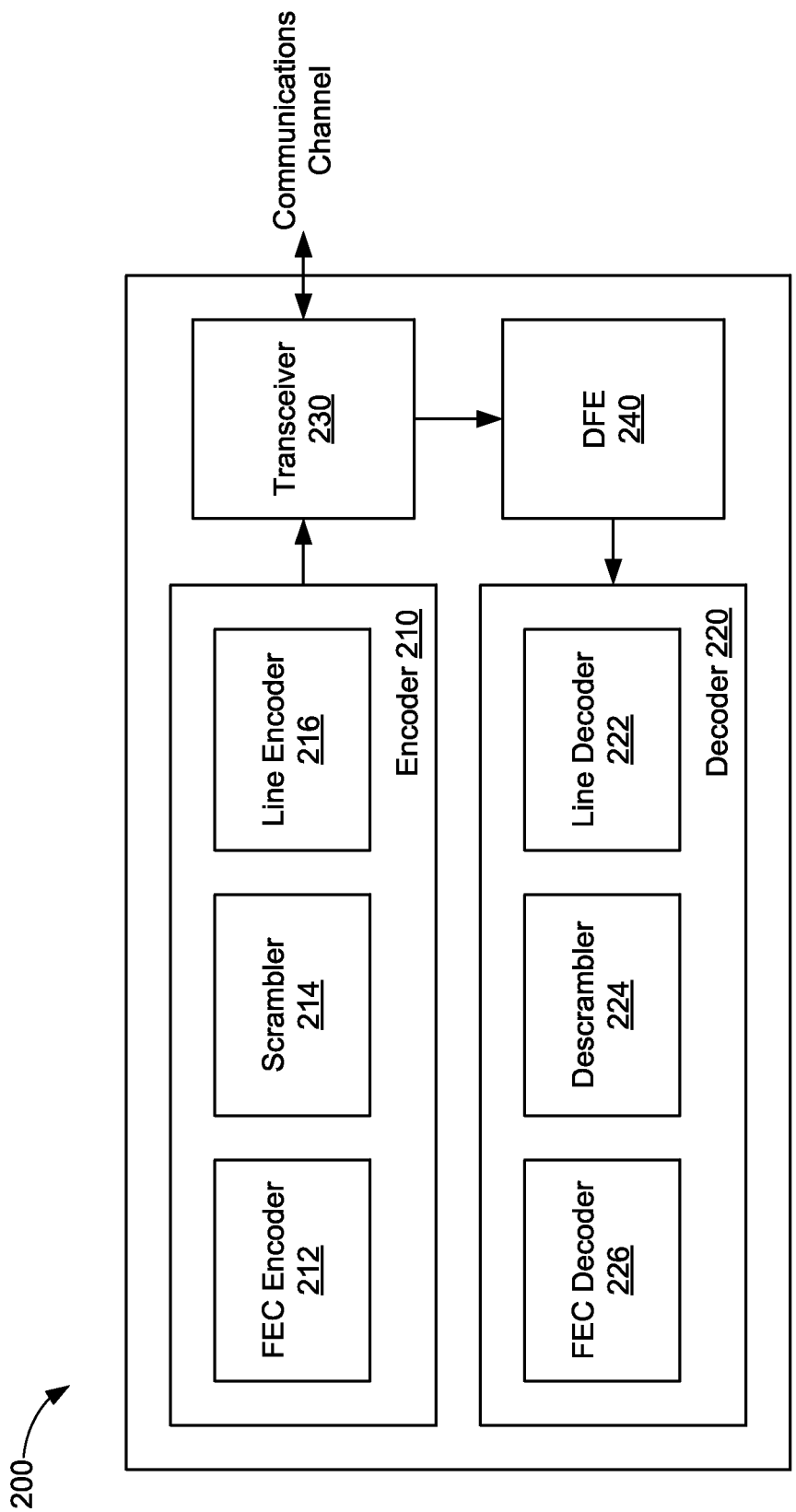

FIG. 2 shows a block diagram of a communications device in accordance with some embodiments.

Figure 3:
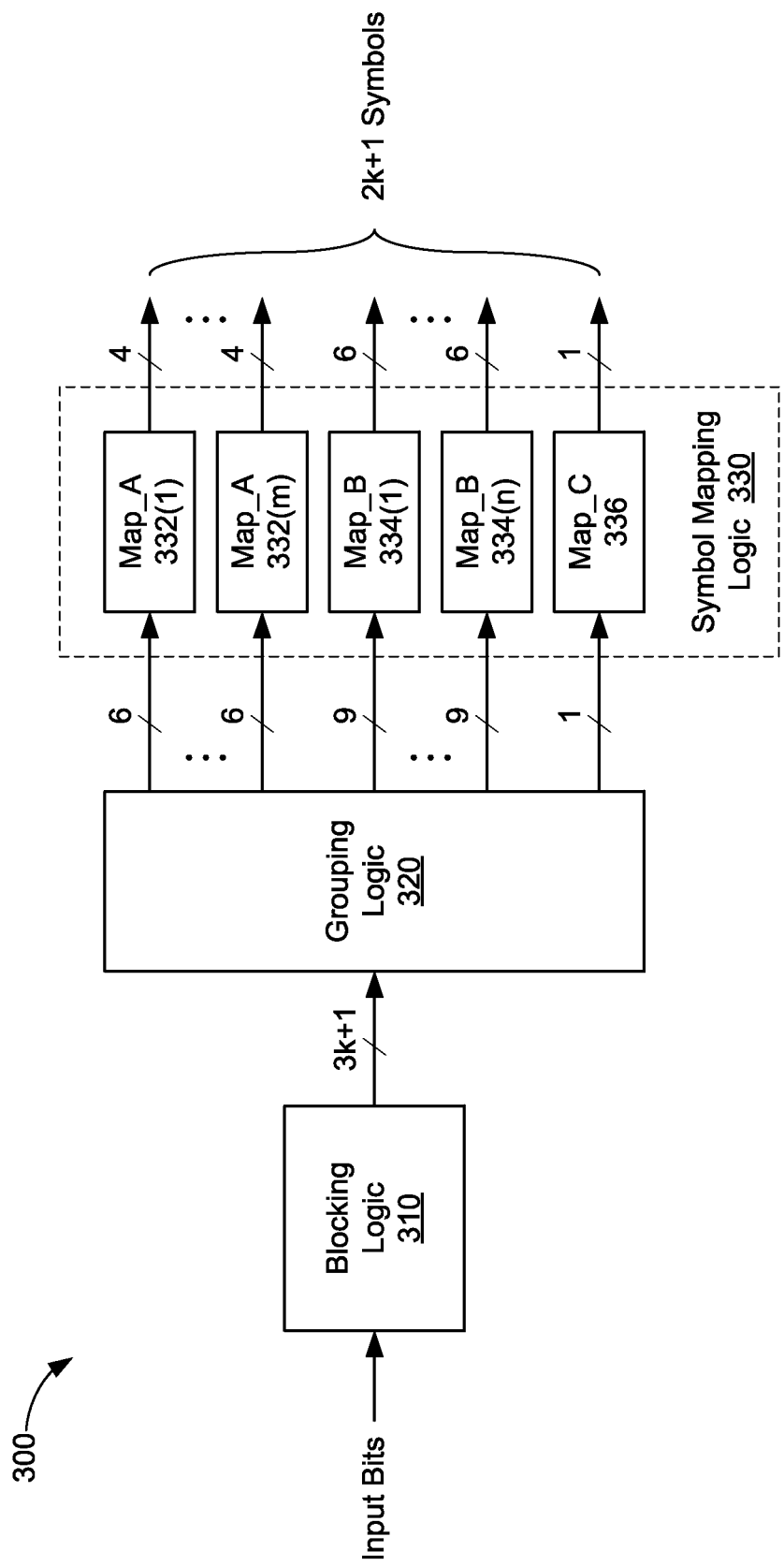

FIG. 3 shows a block diagram of a line encoder in accordance with some embodiments.

Figure 4:
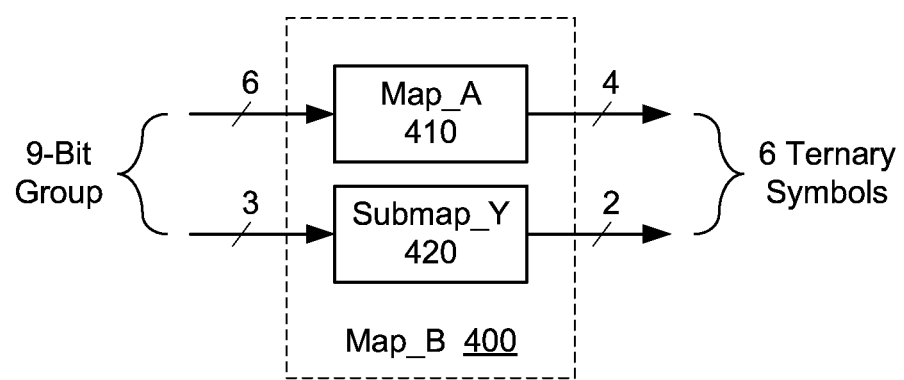

FIG. 4 shows an embodiment of a mapping element implementing the second mapping scheme shown in FIG. 3.

Figure 5:
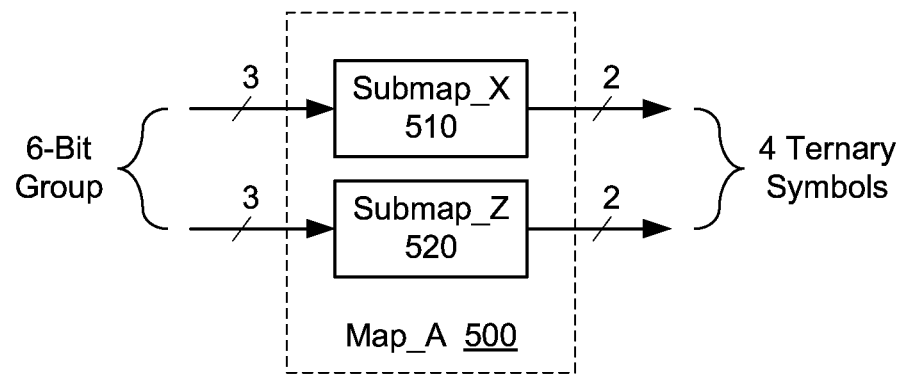

FIG. 5 shows a more detailed embodiment of a mapping element implementing the first mapping scheme shown in FIG. 3.

Figure 6:
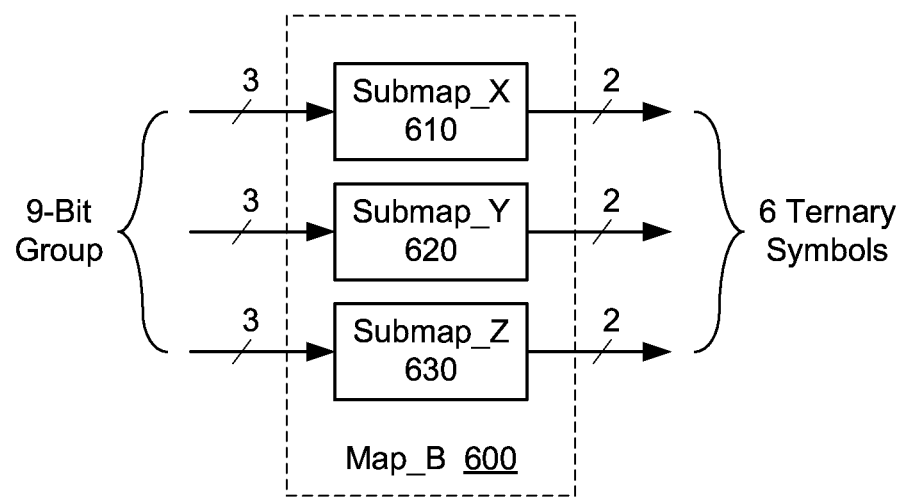

FIG. 6 shows a more detailed embodiment of a mapping element implementing the second mapping scheme shown in FIG. 3.

Figure 7:
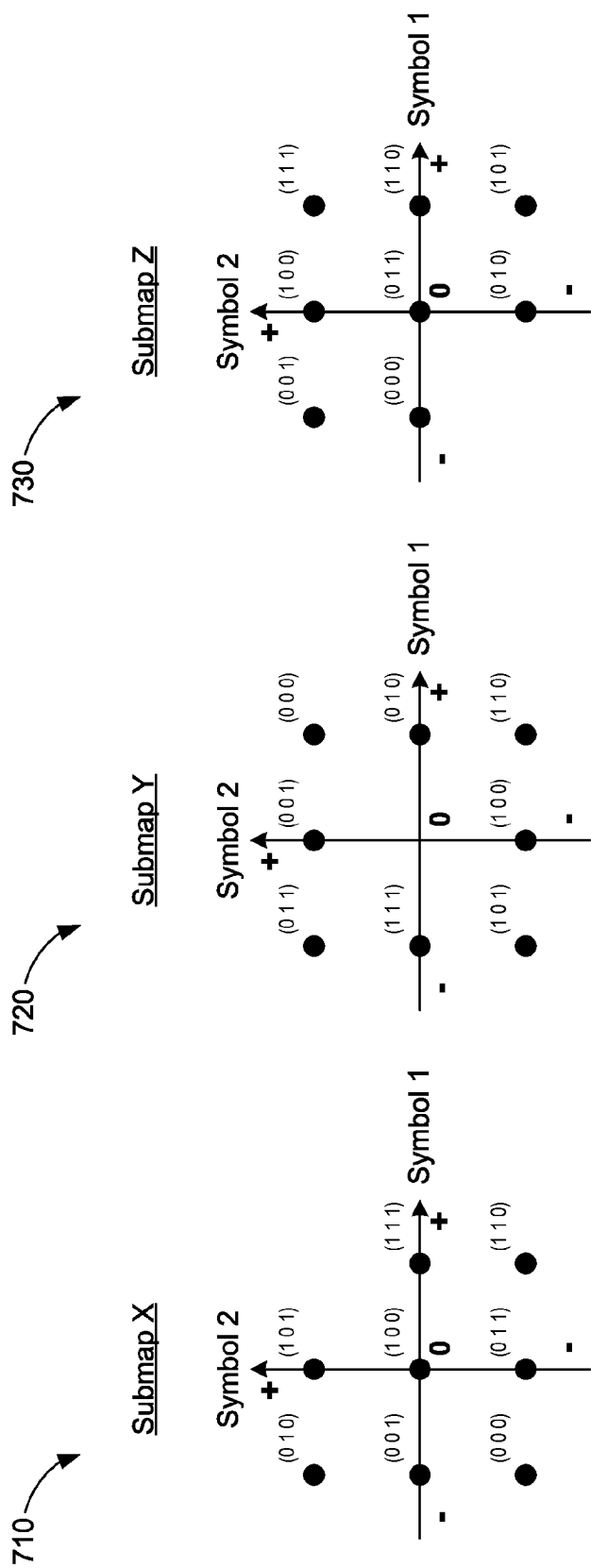

FIGS. 7A-7C illustrate exemplary sub-maps which may be implemented by a symbol mapping logic in accordance with some embodiments.

Figure 8:
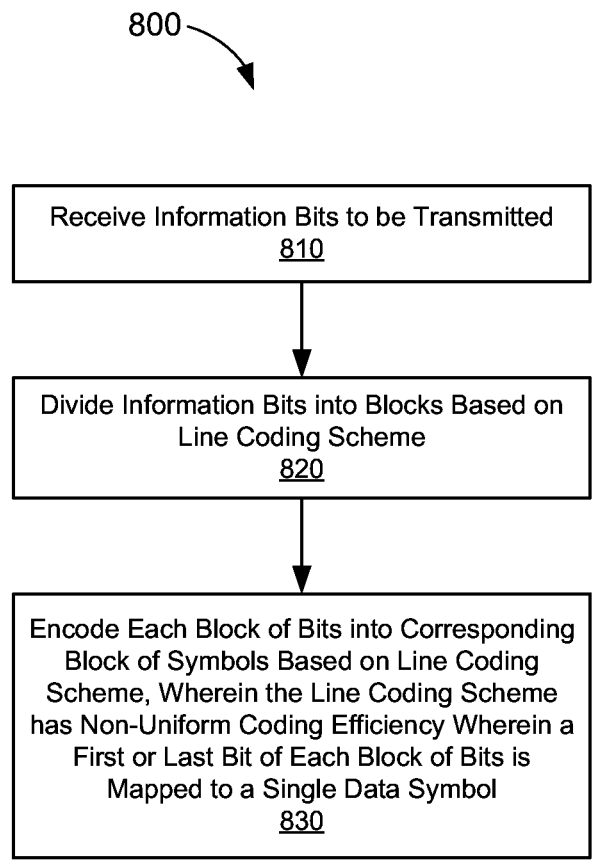
Figure 9:
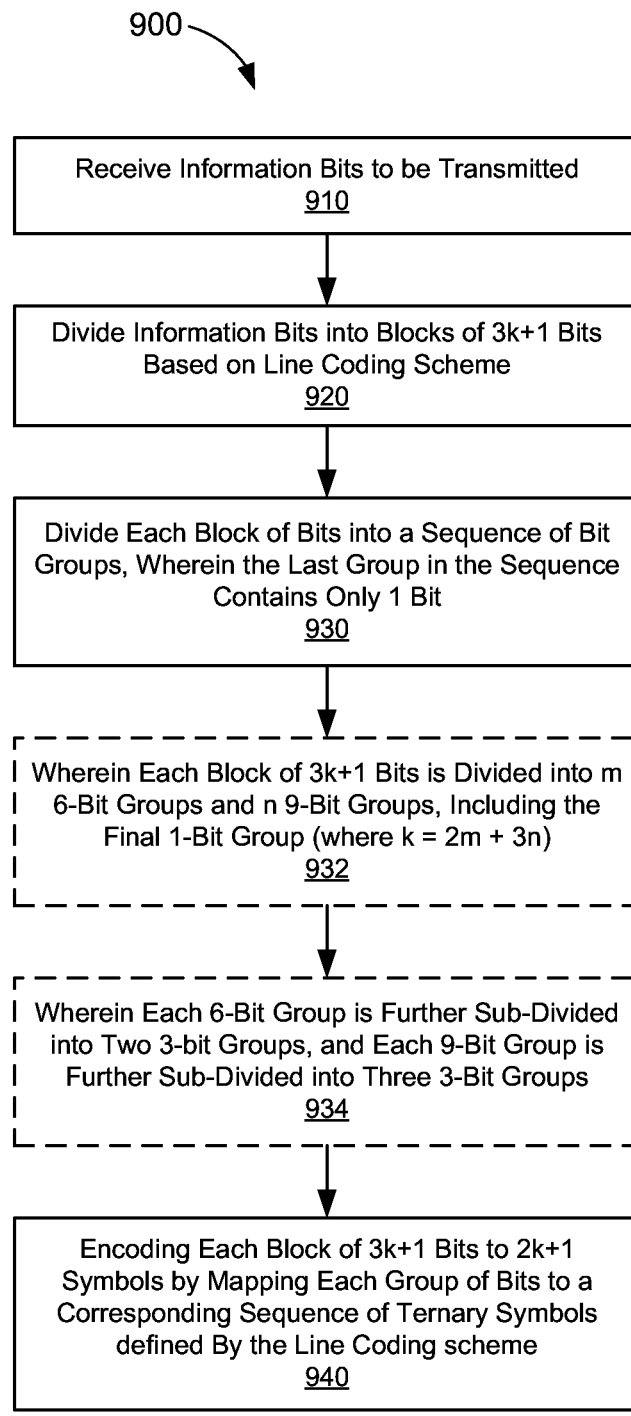

FIGS. 8 and 9 are illustrative flow charts depicting line coding operations in accordance with some embodiments.

Figure 10:
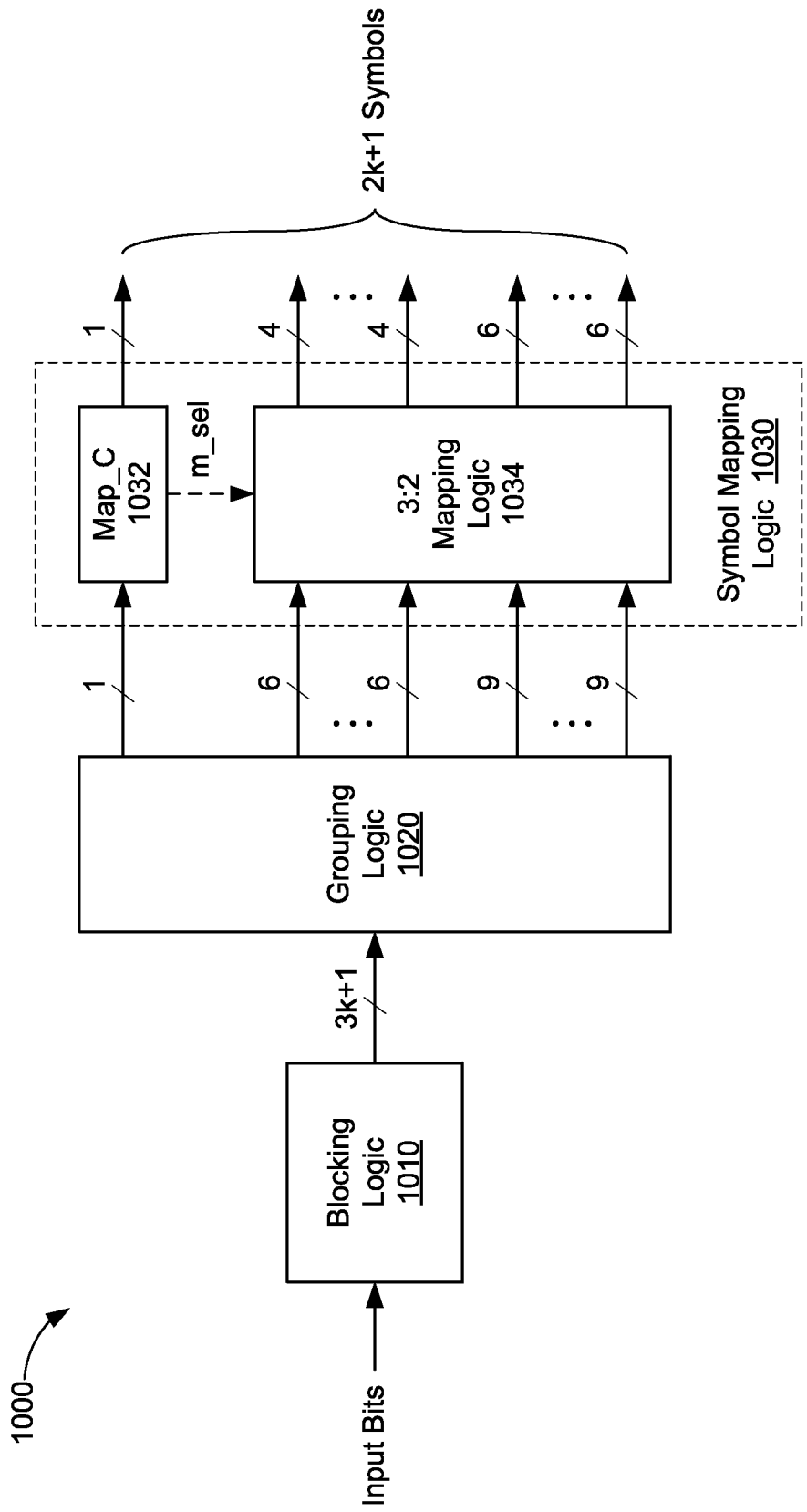

FIG. 10 shows a block diagram of a line encoder in accordance with other embodiments.

Figure 11A:
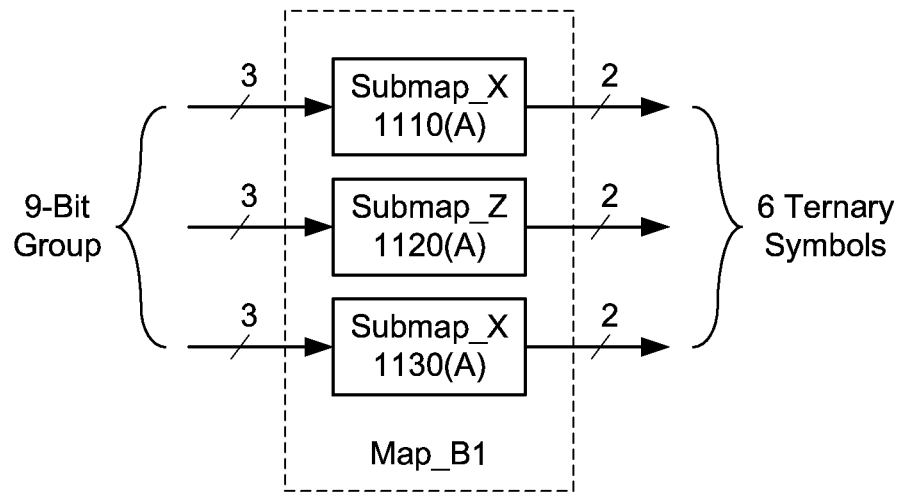
Figure 11B:
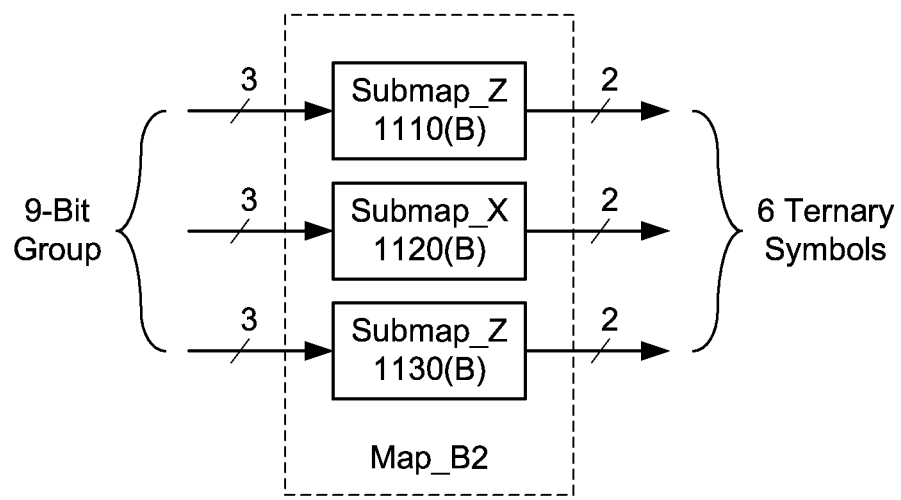

FIGS. 11A-11B are examples of alternative mapping schemes that may be implemented by the 3:2 mapping logic shown in FIG. 10.

Figure 12:
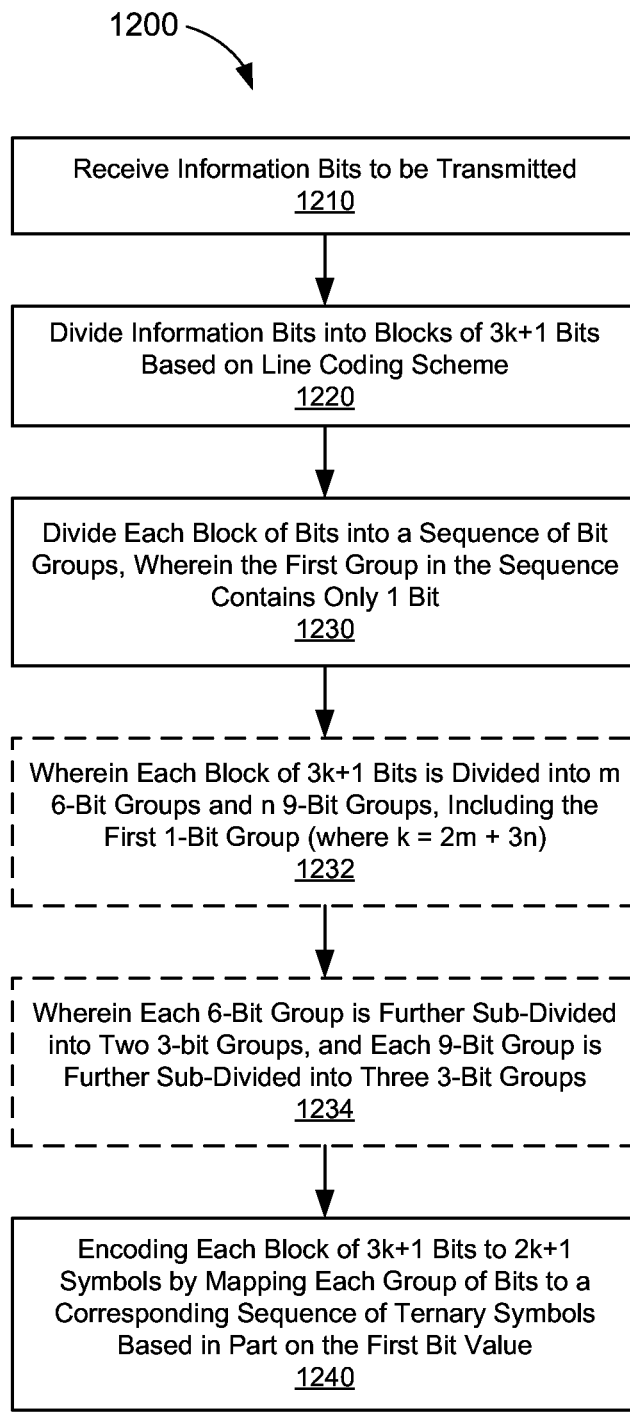

FIG. 12 is an illustrative flow chart depicting a line coding operation in accordance with other embodiments.

Figure 13:
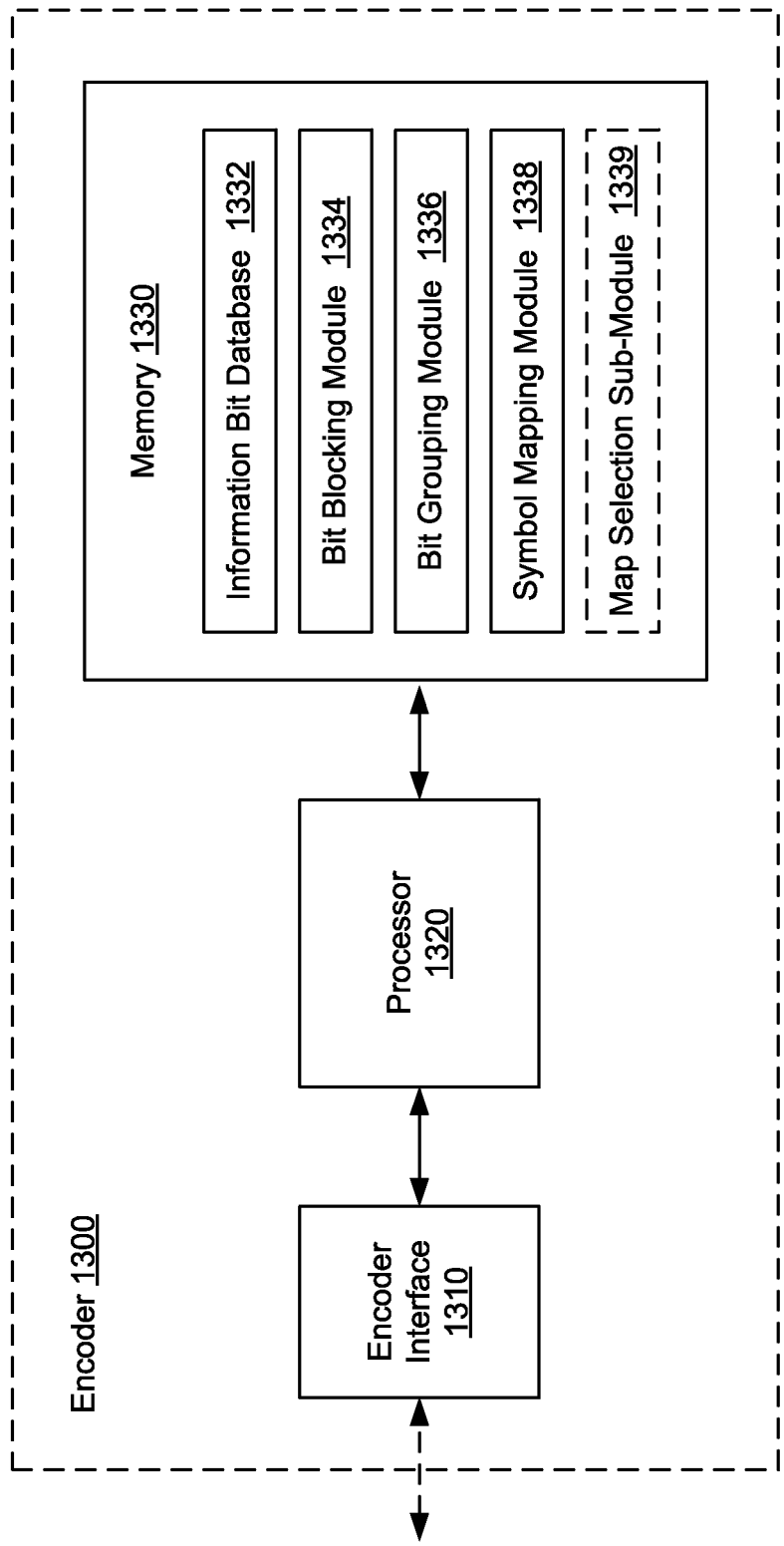

FIG. 13 shows a block diagram of an encoder in accordance with some embodiments.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

FIG. 1 shows a communications system 100 in accordance with some embodiments. A transmitter 110 transmits a signal onto a channel 120, and a receiver 130 receives the signal from the channel 120. The transmitter 110 and receiver 130 may be, for example, computers, switches, routers, hubs, gateways, and/or similar devices. For some embodiments, the communications system 100 is a Gigabit Ethernet system wherein the channel 120 is an unshielded twisted pair of wires (e.g., as defined by the IEEE 802.3bn Task Force). It should be noted, however, that other wired communication standards may be employed by system 100. In other embodiments, the channel 120 may be wireless.

Imperfections of various components in the communications system 100 may become sources of signal impairment, and thus cause signal degradation. For example, imperfections in the channel 120 may introduce channel distortion, which may include linear distortion, multi-path effects, Additive White Gaussian Noise (AWGN), and/or inter-symbol interference (ISI). To combat potential signal degradation, the receiver 130 may include a decision feedback equalizer (DFE) which uses the decision for a received symbol, through feedback, to filter out ISI from the decision for a subsequent symbol. However, as noted above, the DFE is susceptible to error propagation which may affect the decisions for received symbols. For some embodiments, the transmitter 110 may implement a line coding scheme that reduces and/or minimizes error propagation in the DFE of the receiver 130.

FIG. 2 shows a block diagram of a communications device 200 in accordance with some embodiments. The device 200 includes an encoder 210, a decoder 220, a transceiver 230, and a DFE 240. The transceiver 230 is coupled between the encoder 210 and decoder 220, and transmits and/or receives encoded data symbols via a communications channel (e.g., channel 120 of FIG. 1). For some embodiments, the communications channel may be an unshielded twisted pair of wires (e.g., as defined by the IEEE 802.3bn Task Force). When operating as a transmitter (e.g., transmitter 110 of FIG. 1), the transceiver 230 outputs line-coded data symbols from the encoder 210 onto the communications channel. When operating as a receiver (e.g., receiver 130 of FIG. 1), the transceiver 230 receives line-coded data symbols from the communications channel and forwards the received symbols to the decoder 220, via the DFE 240.

The encoder 210 encodes information bits for transmission over the communications channel. More specifically, the encoder 210 includes a forward error correction (FEC) encoder 212, a scrambler 214, and a line encoder 216. The FEC encoder 212 provides error checking and correcting capability by introducing redundancy into the bit stream. For example, redundant bits provide additional information as to what the original information bits should be, and may thus allow a receiver to correct any errors in the received bit stream without requesting re-transmission of the entire bit stream. For some embodiments, the FEC encoder 212 may implement a Reed-Solomon encoding scheme. The scrambler 214 randomizes the (FEC-encoded) information bits to reduce the frequency of long runs of ones and/or zeroes (e.g., to improve clock recovery at the receiver) without introducing additional bits into the bit stream. As described in greater detail below, the line coding scheme implemented by the line encoder 216 may also reduce the run-length of data symbols transmitted over the communications channel. Thus, in alternative embodiments, the scrambler 214 may be omitted entirely.

The line encoder 216 converts the bit stream to a sequence of symbols suitable for transmission over the communications channel. For some embodiments, the line encoder 216 may implement a line coding scheme that reduces and/or minimizes error propagation in the DFE 240. As described above, the DFE 240 uses feedback to mitigate or reduce inter-symbol interference (ISI) in the received symbols. Specifically, the DFE 240 uses the decision for the last-sampled symbol to make a decision for the next symbol in the sequence. For example, the DFE 240 may compare the waveform for the received symbol with the ideal waveform for a symbol of that value to determine the effects of ISI along the communications channel. The DFE 240 may then filter (e.g., subtract) the determined ISI characteristics when deciding the next symbol in the sequence. However, error propagation, as a result of the feedback, may severely degrade the coding gain for purposes of FEC.

An exemplary DFE may apply the following decision logic:

$$x(n)=[y(n)-Ax(n-1)]$$

where x(n) is the output of the DFE; y(n) is the input of the DFE; x(n−1) is the value of previously transmitted symbol, as determined by the DFE; A is the gain of a first feedback tap; and [ ] represents a hard-decision operator that rounds the operand to the nearest "legal" signal point (e.g., a valid symbol for the particular encoding scheme implemented by the communications system). For example, if a set of legal ternary signal points are {1, −1, 0}, then [0.6]=1 and [0.3]=0. If the gain (A) is in the range of 0.5 to 1, the probability of an error burst longer than or equal to k symbols is:

$$\left(\frac{M-1}{M}\right)^{k-1}$$

where M is the modulation size (e.g., M=2 for a binary modulation scheme, M=3 for a ternary modulation scheme, etc.). If a decision error occurs in the DFE, the probability of an error burst at least 11 symbols long is therefore 0.001 for binary signaling (e.g., M=2) and 0.017 for ternary signaling.

For some embodiments, the line encoder 216 may implement a line coding scheme having a non-uniform coding efficiency (e.g., does not always map every three bits to two symbols), thereby enabling the DFE 240 to easily and accurately detect the edges (e.g., the first and/or last symbol) of a "block" of symbols (e.g., a set of symbols of a predetermined size). As a result, any decision errors in the DFE 240 may be constrained within a particular block of symbols, and thus prevented from propagating to subsequent symbol blocks (e.g., in perpetuity). This reduces the likelihood of error in the symbols forwarded by the DFE 240 to the decoder 220.

The decoder 220 decodes the received data symbols by reversing the operations of the encoder 210. Specifically, the decoder 220 includes a line decoder 222, a descrambler 224, and a FEC decoder 226. For example, the line decoder 222 de-maps the received data symbols into a (FEC-encoded) bit stream based on the line coding scheme/mapping implemented by the line encoder 216. Then, the descrambler 224 rearranges (e.g., descrambles) the bits in the bit stream based on the randomization scheme implemented by the scrambler 214. Finally, the FEC decoder 226 checks the bit stream for errors and, after correcting any errors that may have been detected, recovers the original set of information bits.

FIG. 3 shows a block diagram of a line encoder 300 in accordance with some embodiments. The line encoder 300 converts a series of input bits (e.g., a bit stream) into a corresponding series of data symbols. Specifically, the line encoder 300 includes a blocking logic 310, a grouping logic 320, and a symbol mapping logic 330. The blocking logic 310 partitions the received input bits into a series of blocks (e.g., sets of bits of a predetermined size) based on the particular line coding scheme implemented by the line encoder 300. For some embodiments, the blocking logic 310 partitions the input bits into blocks of 3k+1 bits, where k is any integer greater than 1 (e.g., k≥2). The choice of k may depend upon a number of factors including, for example, a desired factorization (e.g., m and n values) described below. However, because k has a direct effect on block length, line coding schemes with smaller k values may be easier to implement in hardware.

The grouping logic 320 further subdivides each block of bits into a number of smaller "groups" based on:

$$k=2m+3n \quad (1)$$

where m and n are both positive integers (which may include 0). For any given k, the block of 3k+1 input bits are divided into m 6-bit groups, n 9-bit groups, and one 1-bit group. It should be noted that, for several values of k, there exist multiple combinations of m and n that satisfy Equation 1. However, the choice of m and n depends largely on power and run-length considerations. For example, a higher n value may result in lower average transmit power. On the other hand, a higher m value may result in higher frequency signal transitions.

The symbol mapping logic 330 converts the block of 3k+1 bits into 2k+1 symbols based on the respective bit groupings. Specifically, the symbol mapping logic 330 includes a number of mapping elements 332(1)-332(m), 334(1)-334(n), and 336 which map a particular group of bits to a corresponding group of symbols. For example, each of the mapping elements 332(1)-332(m) converts one of the m 6-bit groups to a corresponding group of 4 data symbols based on a first mapping scheme (e.g., Map_A). Each of the mapping elements 334(1)-334(n) converts one of the n 9-bit groups to a corresponding group of 6 data symbols based on a second mapping scheme (e.g., Map_B). The mapping element 336 maps a single bit to a single symbol based on a third mapping scheme (e.g., Map_C). For some embodiments, the mapping of bits to symbols is performed in order, such that the final bit of any block of bits is mapped, by the mapping element 336, to single data symbol. For other embodiments, the mapping element 336 may be implemented at the beginning of the symbol mapping logic 330, such that the first bit of any block of bits is mapped to a single data symbol (e.g., as described in greater detail below).

The overall bandwidth efficiency of the line coding scheme implemented by the line encoder 300 approaches 1.5 bits per symbol (e.g., (3k+1)/(2k+1)) as k increases. It should be noted, however, that the mapping scheme implemented by the symbol mapping logic 330 has a non-uniform coding efficiency. For example, the first and second mapping schemes (Map_A and Map_B) have a coding efficiency of 3:2 (1.5 bits per symbol), whereas the third mapping scheme (Map_C) has a coding efficiency of 1:1 (1 bit per symbol). The 1-to-1 encoding of the final bit in a block may allow a DFE to make a fast and accurate hard-decision when it reaches the end of any block of symbols. For example, in some embodiments, the line encoder 300 may implement a ternary line coding scheme (e.g., {−, 0, +}). Restricting the mapping of the last bit to either a "−" symbol (e.g., for a 0 bit) or a "+" symbol (e.g., for a 1 bit) widens the amplitude swing and thereby reduces the chances of the DFE making a decision error on the last bit (e.g., compared to conventional ternary line code implementations wherein the DFE would constantly have to differentiate between all three possible symbol values: −, 0, and +). This ensures a proper determination for the last bit of any particular block, and thus prevents possible decision errors in the rest of the block from propagating beyond the last bit (e.g., to the next block of bits).

The mapping schemes may be implemented as a look-up table and/or logic circuitry. For some embodiments, the first two mapping schemes, (Map_A and Map_B) may be used to maximize the frequency of signal transitions. For other embodiments, Map_A and Map_B may be used to reduce signal power or some form of spectral shaping. For some embodiments, the mapping schemes implemented by the line encoder 300 are ternary mapping schemes, wherein the set of symbols {−, 0, +} represent legal ternary signaling points. It should be noted that "+" and "−" are used herein to denote arbitrary positive and negative signaling values (e.g., amplitudes), respectively.

An exemplary first mapping scheme (Map_A) maps any 6-bit input group to a unique sequence of four ternary symbols, excluding the sequences (+ + ? ?) and (− − ? ?) but inclusive of the sequence (+ + − −), where "?" denotes any arbitrary ternary signal value (e.g., −, 0, or +). This effectively makes it "illegal" to have long runs of consecutive symbols, which, in turn, increases the likelihood of signal transitions in the symbol sequences output by the first mapping elements 332(1)-332(m) and reduces signal transmit power. Accordingly, there are 64 possible sequences of four ternary symbols under the first mapping scheme (e.g., there is a 1-to-1 mapping of 6-bit inputs to 4-symbol outputs).

The second mapping scheme (Map_B) may be implemented as a combination of the first mapping scheme (Map_A), described above, and an additional sub-mapping scheme. FIG. 4 shows an embodiment of a mapping element 400 implementing the second mapping scheme (Map_B) shown in FIG. 3. Specifically, the mapping element 400 includes two sub-mapping elements 410 and 420. The first sub-mapping element 410 implements the first mapping scheme (Map_A) described above, with reference to FIG. 3, which maps the first six bits (of the 9-bit group) to a sequence of four ternary symbols (e.g., excluding the sequences (+ + ? ?) and (− − ? ?) but inclusive of the sequence (+ + − −)). The second sub-mapping element 420 maps the remaining three bits (of the 9-bit group) to two ternary symbols based on a sub-mapping scheme (e.g., Submap_Y).

FIG. 7B illustrates an exemplary sub-mapping scheme 720 for Submap_Y. Specifically, Submap_Y is a ternary sub-map that can be used to map a sequence of three bits (e.g., (1 0 0)) to a corresponding sequence of two symbols (e.g., (+ −)). It should be noted that Submap_Y cannot produce the symbol sequence (0 0) for any 3-bit input sequence. As described above, this is to increase the likelihood of signal transitions in the sequences output by, and between, the sub-mapping elements 410 420, and thereby reduce the run-length of the overall output sequence.

It should be noted that the first two mapping schemes (Map_A and Map_B) may be further subdivided into a number of sub-mapping schemes (e.g., Submap_X, Submap_Y, and Submap_Z) for lower implementation complexity. For example, FIGS. 5 and 6 illustrate embodiments of mapping elements that may be implemented with lower complexity.

FIG. 5 shows a more detailed embodiment of a mapping element 500 implementing the first mapping scheme (Map_A) shown in FIG. 3. The mapping element 500 may correspond to any of the mapping elements 332(1)-332(m), described above with respect to FIG. 3, which maps a 6-bit input to a 4-symbol output. Specifically, the mapping element 500 includes two sub-mapping elements 510 and 520, each of which maps a respective set of three bits (of the 6-bit group) to two corresponding symbols. For example, the sub-mapping element 510 may convert the first three bits of the 6-bit group to two ternary symbols based on a first sub-mapping scheme (e.g., Submap_X). Similarly, the sub-mapping element 520 may convert the next three bits of the 6-bit group to another two ternary symbols based on a second sub-mapping scheme (e.g., Submap_Z).

FIGS. 7A and 7C illustrate exemplary sub-mapping schemes 710 and 730 for Submap_X and Submap_Z, respectively. Specifically, each of the sub-maps 710 and 730 is a ternary sub-map that can be used to map a sequence of three bits (e.g., (1 1 0)) to a corresponding sequence of two symbols (e.g., (+ −)). It should be noted that Submap_X cannot produce the symbol sequence (+ +) for any 3-bit input sequence, while Submap_Z cannot produce the symbol sequence (− −) for any 3-bit input sequence. This is to increase the likelihood of signal transitions in the sequences output by, and between, the first sub-mapping element 510 and the second sub-mapping element 520, and thereby reduce the run-length of the overall output sequence.

FIG. 6 shows a more detailed embodiment of a mapping element 600 implementing the second mapping scheme (Map_B) shown in FIG. 3. The mapping element 600 may correspond to any of the mapping elements 334(1)-334(n), described above with respect to FIG. 3, which maps a 9-bit input group to a 6-symbol output. Specifically, the mapping element 600 includes three sub-mapping elements 610-630, each of which maps a respective set of three bits (of the 9-bit group) to two corresponding symbols. For example, the sub-mapping element 610 may convert the first three bits of the 9-bit group to two ternary symbols based on the sub-mapping scheme Submap_X. The sub-mapping element 620 may convert the next three bits of the 9-bit group to the next two ternary symbols based on the sub-mapping scheme Submap_Y. The sub-mapping element 630 may convert the last three bits of the 9-bit group to the last two ternary symbols based on the sub-mapping scheme Submap_Z.

Two exemplary line coding operations (e.g., in the cases of k=2 and k=3) are herein described with reference to FIGS. 3-5. When k=2, the blocking logic 310 parses a sequence of input bits into blocks of 7 bits. Here, the only possible factorization for k is m=1 and n=0 (see Equation 1). The grouping logic 320 may thus group the 7-bit block into a 6-bit sequence, which is provided to one of the mapping elements 332(1)-332(m), and a 1-bit sequence, which is provided to the mapping element 336. The mapping of the first 6 bits may be further divided into two 3-bit mappings, as described above with respect to FIG. 4. Specifically, the first 3 bits are mapped, by the sub-mapping element 410, to two ternary symbols excluding the symbol sequence (+ +). The last 3 bits are mapped, by the sub-mapping element 420, to two ternary symbols excluding the symbol sequence (− −). Finally, the mapping element 336 maps the single last bit of the 7-bit block to either a "+" or a "−" symbol.

When k=3, the blocking logic 310 parses a sequence of input bits into blocks of 10 bits. Here, the only possible factorization for k is m=0 and n=1 (see Equation 1). The grouping logic 320 may thus group the 10-bit block into a 9-bit sequence, which is provided to one of the mapping elements 334(1)-334(n), and a 1-bit sequence, which is provided to the mapping element 336. The mapping of the first 9 bits may be further divided into three 3-bit mappings, as described above with respect to FIG. 5. Specifically, the first 3 bits are mapped, by the sub-mapping element 510, to two ternary symbols excluding the symbol sequence (+ +). The next 3 bits are mapped, by the sub-mapping element 520, to two ternary symbols excluding the symbol sequence (0 0). The last 3 bits are mapped, by the sub-mapping element 530, to two ternary symbols excluding the symbol sequence (− −). Again, the mapping element 336 maps the single last bit of the 10-bit block to either a "+" or a "−" symbol.

From the examples above, it can be observed that the maximum run-length of consecutive "+" symbols and/or consecutive "−" symbols is 5 for n=0, or 7 for n>0. The maximum run-length of consecutive 0 symbols is 3 for m=3, or 4 for m>0. Thus, the line coding embodiments herein may ensure that at least one signal transition occurs for every 8 symbols.

Furthermore, as described above, any DFE error propagation is limited within a single block of symbols (e.g., as long as |A|<1 and noise is negligible after the first error in the burst).

It should be noted that line codes of the present embodiments can be designed to match the symbol length of Reed-Solomon (RS) codes to achieve higher coding efficiency and simpler hardware implementation. When an RS code is used for FEC encoding, it may be desirable to have the block length (in bits) match the symbol length of the RS code. For example, RS codes with a symbol length of 10 bits tend to work well with the present line coding scheme where k=3. In such a case, each encoded symbol of 10 bits is mapped to a block of 7 line-coded symbols. As noted above, any decision errors (by the DFE) will affect only the bits within an encoded symbol. This allows RS codes with fewer check symbols to be used.

FIG. 8 is an illustrative flow chart depicting a line coding operation 800 in accordance with some embodiments. With reference, for example, to FIG. 2, the encoder 210 first receives a set of information bits to be transmitted across a communications channel (810). For some embodiments, the encoder 210 may perform one or more pre-processing operations on the information bits prior to line encoding. For example, the FEC encoder 212 may introduce redundancy into the set of information bits for error checking/correcting purposes. Further, the scrambler 214 may randomize the order of the FEC-encoded information bits to reduce the frequency of long runs of ones and/or zeroes for purposes of improving clock recovery at the receiver.

The encoder 210 then divides the set of information bits into a plurality of blocks based on a particular line coding scheme (820). For some embodiments, the line coding scheme may reduce and/or minimize error propagation in the DFE of a receiver. For example, the line encoder 216 may partition the set of information bits into blocks of 3k+1 bits, where k is any integer greater than 1. The choice of k may depend upon a number of factors, including, for example, whether lower average transmit power is prioritized over higher frequency signal transitions, or vice-versa. However, because k has a direct effect on block length, line coding schemes with smaller k values may be easier to implement in hardware.

Finally, the encoder 210 encodes each block of bits into a corresponding block of symbols based on the line coding scheme (830). For some embodiments, the line coding scheme may have a non-uniform coding efficiency. For example, the line encoder 216 may convert bits to symbols (within each block) at a non-uniform rate, such that the receiver-side DFE can easily and accurately detect at least one symbol in each of the blocks of symbols. This allows any decision errors in the DFE to be constrained within a particular block of symbols, and thus prevented from propagating to subsequent symbol blocks. Further, for some embodiments, the line coding scheme may ensure that the run-length of each block of symbols is less than the total number of symbols in each block (e.g., by making particular sequences of the same consecutive symbol illegal). This further increases the likelihood of signal transitions in the symbol sequences output by the line encoder 216, thereby improving clock recovery at the receiver.

FIG. 9 is an illustrative flow chart depicting a more detailed line coding operation 900 in accordance with some embodiments. With reference, for example, to FIG. 3, the line encoder 300 first receives a set of information bits to be transmitted across a communications channel (910). As described above, for some embodiments, the information bits may have already been pre-processed through FEC and/or scrambling.

The line encoder 300 then divides the set of information bits into blocks of 3k+1 bits based on a corresponding line coding scheme (920). For example, the blocking logic 310 may partition the set of information bits into blocks of 3k+1 bits, where k is any integer greater than 1. The choice of k may depend on a desired factorization (e.g., m and n values), which affects the average transmit power and/or frequency of signal transitions. For example, a higher n value may result in lower average transmit power. On the other hand, a higher m value may result in higher frequency signal transitions. As described above, line coding schemes with smaller k values may be easier to implement in hardware.

The line encoder 300 further divides each block of bits into a sequence of bit groups, wherein the last group in the sequence contains only one bit (930). For example, the grouping of bits may enable an intra-block symbol mapping with non-uniform coding efficiency. More specifically, the final 1-bit group in the sequence may result in a 1:1 coding efficiency for the last bit in each block. As described above, the non-uniform coding efficiency may allow a receiver-side DFE to make a fast and accurate hard-decision when it reaches the end of any block of symbols. Furthermore, ensuring a proper determination for the last bit in a block prevents possible decision errors in the rest of the block from propagating beyond the last bit (e.g., to the next block of bits).

The grouping logic 320 may group the remaining 3k bits in each block based on Equation 1 (e.g., k=2m+3n). For some embodiments, the grouping logic 320 may divide each block of 3k+1 bits into m 6-bit groups, n 9-bit groups, and the final 1-bit group (932). For other embodiments, the grouping logic 320 may further subdivide each of the 6-bit groups into two 3-bit groups, and each of the 9-bit groups may be further subdivided into three 3-bit groups (934). As described above, sub-dividing each of the 6- and 9-bit groups may allow for lower implementation complexity.

Finally, the line encoder 300 encodes each block of 3k+1 bits to 2k+1 symbols by mapping each group of bits to a corresponding sequence of ternary symbols defined by the line coding scheme (940). It should be noted that, although non-uniform, the overall coding efficiency of the line encoder 300 approaches 1.5 bits per symbol as k increases (e.g., (3k+1)/(2k+1)≈1.5 for k→∞). For example, the symbol mapping logic 330 may convert each of the 6-bit groups to a corresponding group of 4 ternary data symbols based on the first mapping scheme (Map_A) described above, with respect to FIG. 3. The symbol mapping logic 330 may further convert each of the 9-bit groups to a corresponding group of 6 data symbols based on the second mapping scheme (Map_B) described above, with respect to FIG. 3.

For some embodiments, the symbol mapping logic 330 may convert the first three bits of each 6-bit group to a corresponding group of 2 ternary data symbols based on the first sub-mapping scheme (Submap_X) described above, with respect to FIGS. 5 and 7A. The symbol mapping logic 330 may further convert the last three bits of each 6-bit group to a corresponding group of 2 ternary data symbols based on the second sub-mapping scheme (Submap_Z) described above with respect to FIGS. 5 and 7C.

For some embodiments, the symbol mapping logic 330 may convert the first three bits of each 9-bit group to a corresponding group of 2 ternary data symbols based on the first sub-mapping scheme (Submap_X) described above, with respect to FIGS. 6 and 7A. The symbol mapping logic 330 may convert the middle three bits of each 9-bit group to a corresponding group of 2 ternary data symbols based on the third sub-mapping scheme (Submap_Y) described above, with respect to FIGS. 6 and 7B. Further, the symbol mapping logic 330 may convert the last three bits of each 9-bit group to a corresponding group of 2 ternary data symbols based on second sub-mapping scheme (Submap_Z) described above with respect to FIGS. 6 and 7C.

It should be noted that the mapping (and sub-mapping) schemes implemented by the symbol mapping logic 330 treat several combinations of consecutive symbols as illegal (e.g., (+ + ? ?) and (− − ? ?)). Accordingly, these mapping schemes (e.g., Map_A, Map_B, Submap_X, Submap_Y, and Submap_Z) may increase the likelihood of signal transitions in the symbol sequences output by the symbol mapping logic 330. In some instances, the mapping schemes herein may also reduce the power needed to transmit such symbols across the communications channel.

FIG. 10 shows a block diagram of a line encoder 1000 in accordance with other embodiments. The line encoder 1000 includes a blocking logic 1010, a grouping logic 1020, and a symbol mapping logic 1030. The blocking logic 1010 and grouping logic 1020 perform substantially the same function as blocking logic 310 and grouping logic 320, respectively, of the line encoder 300. For example, the block logic 1010 partitions the received input bits into blocks of 3k+1 bits (for k≥2), and the grouping logic 1020 further subdivides each block of bits into m 6-bit groups, n 9-bit groups, and one 1-bit group (e.g., as described above with respect to FIG. 3).

The symbol mapping logic 1030 converts the block of 3k+1 bits into 2k+1 symbols based on their respective groupings. Specifically, the symbol mapping logic 1030 includes a first mapping element 1032 and a 3:2 mapping logic 1034. The first mapping element 1032 maps the first bit of any block of 3k+1 bits to a single symbol based on the third mapping scheme (e.g., Map_C) described above with respect to FIG. 3. The 1-to-1 encoding of the first bit in a block may allow a DFE to make a fast and accurate hard-decision when it reaches the beginning of a new block of symbols. For example, the first mapping element 1032 may map the first bit of a given block to either a "+" or a "−" symbol (effectively treating "0" as an illegal symbol value in a ternary line coding scheme). This ensures a proper determination for the first bit of any block and preventing possible decision errors from a previous block from propagating beyond the first bit of the current block.

The 3:2 mapping logic 1034 maps the remaining 3k bits of a corresponding block to the remaining 2k symbols. Although not shown for simplicity, the 3:2 mapping logic 1034 may include a number of mapping elements that map each 6- and/or 9-bit groups to a corresponding group of 4 and/or 6 symbols, respectively (e.g., mapping elements 332(1)-332(m) and 334(1)-334(n), as described above with respect to FIG. 3). For some embodiments, the 3:2 mapping logic 1034 may implement one of multiple alternative mapping (and/or sub-mapping) schemes based on a map selection signal (m_sel) output by the first mapping element 1032. Specifically, the first mapping element 1032 may selectively assert the map selection signal based on the bit value (or corresponding symbol value) of the received first bit of a block of bits. For example, the first mapping element 1032 may assert the map selection signal upon determining that the first bit of a corresponding block has a value of "1" (or a "+" symbol value). Further, the first mapping element 1032 may deassert the map selection signal upon determining that the first bit of a corresponding block has a value of "0" (or a "−" symbol value).

FIGS. 11A-11B are examples of alternative mapping schemes that may be implemented by the 3:2 mapping logic shown in FIG. 10. More specifically, FIGS. 11A and 11B illustrate two variations of a 9-to-6 mapping scheme (e.g., Map_B1 and Map_B2) that may be implemented by the 3:2 mapping logic 1034. For example, the 3:2 mapping logic 1034 may implement the mapping scheme Map_B1 (e.g., for mapping 9-bit groups to corresponding 6-symbol outputs) if the map selection signal is asserted. The 3:2 mapping logic 1034 may alternatively implement the mapping scheme Map_B2 (e.g., in lieu of Map_B1) if the map selection signal is deasserted.

For some embodiments, the mapping scheme Map_B1 may be implemented using a set of sub-mapping elements 1110(A)-1130(A). For example, the sub-mapping element 1110(A) may convert the first three bits of a 9-bit group to two ternary symbols based on the sub-mapping scheme Submap_X (depicted in FIG. 7A). The sub-mapping element 1120(A) may convert the next three bits of the 9-bit group to the next two ternary symbols based on the sub-mapping scheme Submap_Z (depicted in FIG. 7C). The sub-mapping element 1130(A) may convert the last three bits of the 9-bit group to the last two ternary symbols based on the sub-mapping scheme Submap_X.

For some embodiments, the mapping scheme Map_B2 may be implemented using a set of sub-mapping elements 1110(B)-1130(B). For example, the sub-mapping element 1110(B) may convert the first three bits of a 9-bit group to two ternary symbols based on the sub-mapping scheme Submap_Z. The sub-mapping element 1120(B) may convert the next three bits of the 9-bit group to the next two ternary symbols based on the sub-mapping scheme Submap_X. The sub-mapping element 1130(B) may convert the last three bits of the 9-bit group to the last two ternary symbols based on the sub-mapping scheme Submap_Z.

The exemplary line coding scheme described above, with respect to FIGS. 11A-11B, may produce symbol blocks having a maximum run-length of four consecutive "+" or "−" symbols and a maximum run-length of six consecutive "0" symbols. Further, it should be noted that this line coding scheme is particularly well-suited for Reed Solomon codes over Galois Field $GF(2^{10})$. However, embodiments of the 3:2 mapping logic 1034 are not limited to the implementations above. For example, in other embodiments, the 3:2 mapping logic 1034 may implement multiple variations of 9-to-6 and/or 6-to-4 mapping schemes using any combination of sub-mapping schemes (e.g., Submap_X, Submap_Y, and/or Submap_Z).

FIG. 12 is an illustrative flow chart depicting a line coding operation 1200 in accordance with other embodiments. With reference, for example, to FIG. 10, the line encoder 1000 first receives a set of information bits to be transmitted across a communications channel (1210). For some embodiments, the information bits may have been pre-processed through FEC and/or scrambling.

The line encoder 1000 then divides the set of information bits into blocks of 3k+1 bits based on a corresponding line coding scheme (1220). For example, the blocking logic 1010 may partition the set of information bits into blocks of 2k+1 bits (for k≥2). As described above, the choice of k may depend on a balancing of transmit power, frequency of signal transitions, and/or hardware complexity.

The line encoder 1000 further divides each block of bits into a sequence of bit groups, wherein the first group in the sequence contains only one bit (1230). As described above, the grouping of bits provides an intra-block symbol mapping with non-uniform coding efficiency. Specifically, encoding a 1-bit group at the start of each block allows a receiver-side DFE to make a fast and accurate hard-decision when it reaches the beginning of a new block of symbols. This ensures that any decision errors from a previous block do not propagate into the next.

The grouping logic 1020 may group the remaining 3k bits in each block based on Equation 1 (e.g., k=2m+3n). For some embodiments, the grouping logic 1020 may divide the 3k+1 bits into m 6-bit groups and n 9-bit groups, including the first 1-bit group (1232). For other embodiments, the grouping logic 1020 may further subdivide each of the 6-bit groups into two 3-bit groups, and each 9-bit group may be further subdivided into three 3-bit groups (1234). As described above, sub-dividing each of the 6- and 9-bit groups may allow for lower implementation complexity.

Finally, the line encoder 1000 encodes each block of 3k+1 bits to 2k+1 symbols by mapping each group of bits to a corresponding sequence of ternary symbols based, at least in part, on the first bit value (1240). For example, the mapping element 1032 may map the first bit of a block to a corresponding ternary symbol. For some embodiments, the mapping element 1032 may assert and/or deassert the map selection signal based on the determined value for the first bit (e.g., assert m_sel for bit value "1" or symbol value "+"; deassert m_sel for bit value "0" or symbol value "−"). The 3:2 mapping logic 1034 may implement one of multiple alternative mapping and/or sub-mapping schemes, to encode the remaining 3k bits, based on whether the map selection signal is asserted or deasserted.

For some embodiments, each of the mapping (and/or submapping) schemes implemented by the 3:2 mapping logic 1034 may treat several combination of consecutive symbols as illegal (e.g., as described above with reference to FIGS. 3-9). This is to increase the likelihood of signal transitions among the symbol sequences output by the symbol mapping logic 1030. In some instances, the mapping schemes may further reduce the power needed to transmit such symbols across the communications channel.

FIG. 13 shows a block diagram of an encoder 1300 in accordance with some embodiments. The encoder 1300 includes an encoder interface 1310, a processor 1320, and a memory 1330. The encoder interface 1310 may be used for communicating data to and/or from the encoder 1300. For example, the encoder interface 1310 may receive information bits (e.g., from a CPU) to be encoded into one or more codewords. The encoder interface 1310 may also output codewords generated by the encoder 1300 (e.g., to a transceiver).

Memory 1330 may include an information bit database 1332 that may be used as a local cache to store information bits that are to be transmitted, via a communications channel, to a receiving device. Furthermore, memory 1330 may also include a non-transitory computer-readable storage medium (e.g., one or more nonvolatile memory elements, such as EPROM, EEPROM, Flash memory, a hard drive, etc.) that can store the following software modules:

- a bit blocking module 1334 to partition a set of information bits into a plurality of blocks of bits (e.g., of a predetermined sized) based on a particular line coding scheme;
- a bit grouping module 1336 to further subdivide each block of bits into a number of smaller bit groupings of varying size;
- a symbol mapping module 1338 to convert each block of bits into a corresponding block of symbols based on the respective bit groupings; and
- a map selection sub-module 1339 to select a mapping and/or sub-mapping scheme to be implemented by the symbol mapping module 1338.

Each software module may include instructions that, when executed by the processor 1320, may cause the encoder 1300 to perform the corresponding function. Thus, the non-transitory computer-readable storage medium of memory 1330 may include instructions for performing all or a portion of the operations described with respect to FIGS. 8, 9, and 12.

The processor 1320, which is coupled between the encoder interface 1310 and the memory 1330, may be any suitable processor capable of executing scripts of instructions of one or more software programs stored in the encoder 1300 (e.g., within memory 1330). For example, the processor 1320 can execute the bit blocking module 1334, the bit grouping module 1336, the symbol mapping module 1338, and/or the map selection sub-module 1339.

The bit blocking module 1334 may be executed by the processor 1320 to partition a set of information bits into a plurality of blocks of bits based on a particular line coding scheme. For some embodiments, the processor 1320, in executing the bit blocking module 1334, may partition the information bits into blocks of 3k+1 bits, where k is any integer greater than 1 (e.g., k≥2). The choice of k may depend upon a number of factors, including, for example, whether lower average transmit power is prioritized over higher frequency signal transitions, or vice-versa. However, because the value of k has a direct effect on block length, line coding schemes with smaller k values may have simpler hardware implementations.

The bit grouping module 1336 may be executed by the processor 1320 to further subdivide each block of bits into a number of smaller bit groupings of varying size. For some embodiments, the processor 1320, in executing the bit grouping module 1336, may divide each block of 3k+1 bits into a number (m) of 6-bit groups, a number (n) of 9-bit groups, and a 1-bit group, where k=2m+3n. For some embodiments, the 1-bit group may correspond to the first or last bit (e.g., in sequence) of a respective block of bits. The choice of m and n may depend on power and run-length considerations. For example, a higher n value may result in lower average transmit power, whereas a higher m value may result in higher frequency signal transitions. For some embodiments, the bit grouping module 1336, as executed by the processor 1320, may further subdivide each of the 6-bit groups into two 3-bit groups (e.g., as described above with respect to FIG. 5), and each 9-bit group may be further subdivided into three 3-bit groups (e.g., as described above with respect to FIGS. 6 and 11A-11B).

The symbol mapping module 1338 may be executed by the processor 1320 to convert each block of bits into a corresponding block of symbols based on the respective bit groupings. More specifically, the processor 1320, in executing the symbol mapping module 1338, may convert each block of 3k+1 bits into a corresponding block of 2k+1 symbols based on multiple mapping and/or sub-mapping schemes (e.g., to produce an overall line coding scheme with non-uniform coding efficiency). For example, a particular symbol map (e.g., Map_A, Map_B, or Map_C) and/or combination of sub-maps (e.g., Submap_X, Submap_Y, and/or Submap_Z) may be used to convert each grouping of bits (e.g., 6-bit group, 9-bit group, and 1-bit group) to a corresponding group of symbols. Thus, each 9-bit group may be mapped to 6 data symbols, each 6-bit group may be mapped to 4 data symbols, and each 1-bit group may be mapped to a single data symbol. More specifically, the mapping of bits to symbols may be performed in sequence, such that the 1-bit group (e.g., corresponding to the first or last bit of a particular block of bits) is mapped to a single data symbol.

For some embodiments, the processor 1320 may execute the map selection sub-module 1339 to select a mapping and/or sub-mapping scheme to be implemented by the symbol mapping module 1338. For example, the map selection sub-module 1339 may enable the processor 1320 to switch between multiple possible combinations of symbol maps and/or sub-maps to allow for an even greater range and/or variations of symbol mapping. For some embodiments, the processor 1320, in executing the map selection sub-module 1339, may selecting a mapping (and/or sub-mapping) scheme based on the bit value (or corresponding symbol value) of the 1-bit group of each block of bits. For example, upon receiving a block of 3k+1 bits to be encoded, the processor 1320 may first determine the bit value of the 1-bit group in the block (e.g., corresponding to the first bit of the block of bits) and, based on the map selection sub-module 1339, determine a mapping scheme to be applied to the remaining 3k bits in that block.

In the foregoing specification, the present embodiments have been described with reference to specific exemplary embodiments thereof. It will, however, be evident that various modifications and changes may be made thereto without departing from the broader scope of the disclosure as set forth in the appended claims. For example, the method steps depicted in the flow charts of FIGS. 8, 9, and 12 may be performed in other suitable orders, multiple steps may be combined into a single step, and/or some steps may be omitted. The specification and drawings are, accordingly, to be regarded in an illustrative sense rather than a restrictive sense.

What is claimed is:

1. A method of data encoding comprising:
   receiving a set of bits to be transmitted over a channel;
   dividing the set of bits into a plurality of blocks based, at least in part, on a line coding scheme; and
   encoding each of the blocks of bits into a corresponding block of symbols based on the line coding scheme, wherein the line coding scheme has a non-uniform coding efficiency, and wherein the encoding comprises one from a group consisting of:
      for each block of bits, mapping a first bit of the block of bits to a single data symbol; and
      for each block of bits, mapping a last bit of the block of bits to a single data symbol.

2. The method of claim 1, wherein the line coding scheme is a ternary line coding scheme that maps a block of 3k+1 bits to a corresponding block of 2k+1 symbols, wherein k is an integer greater than 1.

3. The method of claim 2, wherein dividing the set of bits into a plurality of blocks comprises:
   dividing each block of 3k+1 bits into a number (m) of 6-bit groups, a number (n) of 9-bit groups, and a 1-bit group, wherein k=2m+3n.

4. The method of claim 3, wherein the 1-bit group is mapped to either a positive ternary symbol or a negative ternary symbol which corresponds to a first symbol or a last symbol in a particular block of symbols.

5. The method of claim 4, wherein a mapping of the remaining 3k bits in the block is based, at least in part, on a symbol value of the 1-bit group.

6. The method of claim 5, wherein the mapping of the remaining 3k bits is based on a first mapping scheme when the symbol value of the 1-bit group is positive, and wherein the mapping of the remaining 3k bits is based on a second mapping scheme when the symbol value of the 1-bit group is negative.

7. The method of claim 3, wherein each of the 6-bit groups is mapped to a unique sequence of 4 ternary symbols, and wherein each of the 9-bit groups is mapped to a unique sequence of 6 ternary symbols.

8. The method of claim 7, further comprising:
   subdividing each of the 6-bit groups into two 3-bit groups, including:
      a first 3-bit group which maps to a sequence of 2 ternary symbols, excluding any sequence consisting of two consecutive positive ternary symbols, and
      a second 3-bit group which maps to a sequence of 2 ternary symbols, excluding any sequence consisting of two consecutive negative ternary symbols.

9. The method of claim 7, further comprising:
   subdividing each of the 9-bit groups into three 3-bit groups, including:
      a third 3-bit group which maps to a sequence of 2 ternary symbols, excluding any sequence consisting of two consecutive positive ternary symbols,
      a fourth 3-bit group which maps to a sequence of 2 ternary symbols, excluding any sequence consisting of two consecutive zero ternary symbols, and
      a fifth 3-bit group which maps to a sequence of 2 ternary symbols, excluding any sequence consisting of two consecutive negative ternary symbols.

10. The method of claim 1, wherein a run length of a respective block of symbols is less than a number of symbols in the respective block.

11. A communications device, comprising:
   a memory element to store a set of information bits to be transmitted over a channel, and to store instructions; and
   one or more processors that, upon execution of the instructions by the one or more processors, cause the communications device to:
      divide the set of information bits into a plurality of blocks based, at least in part, on a line coding scheme; and
      encode each of the blocks of bits into a corresponding block of symbols based on the line coding scheme, and wherein the encoding comprises one from a group consisting of:
         for each block of bits, mapping a first bit of the block of bits to a single data symbol; and
         for each block of bits, mapping a last bit of the block of bits to a single data symbol.

12. The communications device of claim 11, wherein the line coding scheme is a ternary line coding scheme that maps a block of 3k+1 bits to a corresponding block of 2k+1 symbols, wherein k is an integer greater than 1.

13. The communications device of claim 12, wherein execution of the instructions to divide the set of bits causes the communications device to:
   divide each block of 3k+1 bits into a number (m) of 6-bit groups, a number (n) of 9-bit groups, and a 1-bit group, wherein k=2m+3n.

14. The communications device of claim 13, wherein the 1-bit group is mapped to either a positive ternary symbol or a negative ternary symbol which corresponds to a first symbol or a last symbol in a particular block of symbols.

15. The communications device of claim 14, wherein a mapping of the remaining 3k bits in the block is based, at least in part, on a symbol value of the 1-bit group.

16. The communications device of claim 15, wherein the mapping of the remaining 3k bits is based on a first mapping scheme when the symbol value of the 1-bit group is positive, and wherein the mapping of the remaining 3k bits is based on a second mapping scheme when the symbol value of the 1-bit group is negative.

17. The communications device of claim 13, wherein each of the 6-bit groups is mapped to a unique sequence of 4 ternary symbols, and wherein each of the 9-bit groups is mapped to a unique sequence of 6 ternary symbols.

18. The communications device of claim 17, wherein execution of the instructions further causes the communications device to:
subdivide each of the 6-bit groups into two 3-bit groups, including:
a first 3-bit group which maps to a sequence of 2 ternary symbols, excluding any sequence consisting of two consecutive positive ternary symbols, and
a second 3-bit group which maps to a sequence of 2 ternary symbols, excluding any sequence consisting of two consecutive negative ternary symbols.

19. The communications device of claim 17, wherein execution of the instructions further causes the communications device to:
subdivide each of the 9-bit groups into three 3-bit groups, including:
a third 3-bit group which maps to a sequence of 2 ternary symbols, excluding any sequence consisting of two consecutive positive ternary symbols,
a fourth 3-bit group which maps to a sequence of 2 ternary symbols, excluding any sequence consisting of two consecutive zero ternary symbols, and
a fifth 3-bit group which maps to a sequence of 2 ternary symbols, excluding any sequence consisting of two consecutive negative ternary symbols.

20. A non-transitory computer-readable storage medium containing program instructions that, when executed by a processor provided within a communications device, causes the communications device to:
receive a set of bits to be transmitted over a channel;
divide the set of bits into a plurality of blocks based, at least in part, on a line coding scheme; and
encode each of the blocks of bits into a corresponding block of symbols based on the line coding scheme, wherein the line coding scheme has a non-uniform coding efficiency, and wherein the encoding comprises one from a group consisting of:
for each block of bits, mapping a first bit of the block of bits to a single data symbol; and
for each block of bits, mapping a last bit of the block of bits to a single data symbol.

* * * * *